(12) United States Patent
Yoshida et al.

(10) Patent No.: US 6,528,724 B1
(45) Date of Patent: Mar. 4, 2003

(54) MICRODEVICE AND ITS PRODUCTION METHOD

(75) Inventors: Yukihisa Yoshida, Tokyo (JP); Martial Chabloz, Tokyo (JP); Jiwei Jiao, Tokyo (JP); Tsukasa Matsuura, Tokyo (JP); Kazuhiko Tsutsumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/889,424

(22) PCT Filed: Jan. 19, 2000

(86) PCT No.: PCT/JP00/00222

§ 371 (c)(1),
(2), (4) Date: Oct. 19, 2001

(87) PCT Pub. No.: WO01/53194

PCT Pub. Date: Jul. 26, 2001

(51) Int. Cl.⁷ ............................................. H01L 23/02
(52) U.S. Cl. .............................. 174/52.4; 73/862.473; 29/592.1; 29/825
(58) Field of Search ...................... 174/52.4; 257/776; 29/592.1, 825; 73/862.473, 862.451

(56) References Cited

U.S. PATENT DOCUMENTS 5,501,893 A    3/1996   Laermer et al.
5,905,241 A  * 5/1999   Park et al. ................. 200/409
6,025,252 A  * 2/2000   Shindo et al. .............. 438/509

FOREIGN PATENT DOCUMENTS

JP    11-118826 A    4/1999

OTHER PUBLICATIONS

Xiao et al.; "Laterally Capacity Sensed Accelerometer Fabricated With Anodic Bonding And High Aspect Ratio Etching", *Transducers '99*, pp. 1518–1521, Jun. 7–10, 1999, Sendai, Japan.

Kobayashi et al.; "Double–Frame Silicon Gyroscope Packaged Under Low Pressure By Wafer Bonding", *Transducers '99*, pp. 910–913, Jun. 7–10, 1999, Sendai, Japan..

* cited by examiner

*Primary Examiner*—Hung V. Ngo
(74) *Attorney, Agent, or Firm*—Leydig, Voit & Mayer, Ltd.

(57) ABSTRACT

A micro device including an insulating substrate having a recess formed on a surface, and a beam-like silicon structure on the front surface of the insulating substrate surrounding the recess. The beam-like structure includes at least one functional section, and the functional section has a supporting section bonded to the insulating substrate and at least one cantilever integral with the supporting section and extending across the recess. The micro device also has an electrically conductive film electrically connected to the supporting section, on the surface of the recess at least directly under a cantilever. The electrically conductive film prevents the surface of the recess from being positively charged in the dry etching process. Thus, an etching gas having a positive charge is not subjected to electrical repulsion from the recess and does not impinge on the back surface of the silicon substrate, and therefore erosion of the cantilever does not occur. As a result, since the beam-like structure is formed with high accuracy in shape and dimensions, the micro device has improved reliability and an improved degree of freedom in design.

5 Claims, 10 Drawing Sheets

MICRODEVICE AND ITS PRODUCTION METHOD

TECHNICAL FIELD

The invention relates to a micro device used in inertial force sensor, optical switch or the like, and particularly to a micro device comprising an insulating substrate and a beam-like structure made of silicon formed on the insulating substrate, and a method of manufacturing the same.

BACKGROUND ART

Recently it has been made possible to etch silicon as deep as 100 μm by means of reactive ion etching (RIE) technology using inductively coupled plasma (ICP) as the activation energy source (hereinafter referred to as ICP-RIE process). This technique is viewed as a promising new technique for making silicon structures of high aspect ratios with a sufficiently high etching rate, in the field of device development by a micromachining. In the past, the wet process using an alkali solution was predominant as the process of deep etching of silicon substrates. But it is difficult to make a desired structure by the wet process, because the direction of etching depends on the crystal orientation of silicon in the wet process. In contrast, the ICP-RIE process is not subject to anisotropy of etching because it is a dry process. Thus the ICP-RIE process has such an advantage over the wet process that far higher degree of freedom in designing the configuration of structure can be achieved than in the case of the wet process.

When machining by dry etching a silicon substrate whereon a mask film has been formed in a desired pattern by photolithography or the like, however, there occurs such a problem that a wider area (exposed through a wider aperture) is etched at a higher rate than a narrower area. This is caused by micro loading effect, which is a well-known phenomenon in the field of semiconductor manufacturing processes. This phenomenon has such an adverse effect as described below on the micro devices which fall in the scope of the present invention, namely micro devices comprising an insulating substrate and a beam-like structure made of silicon formed on the insulating substrate.

Figure 15:
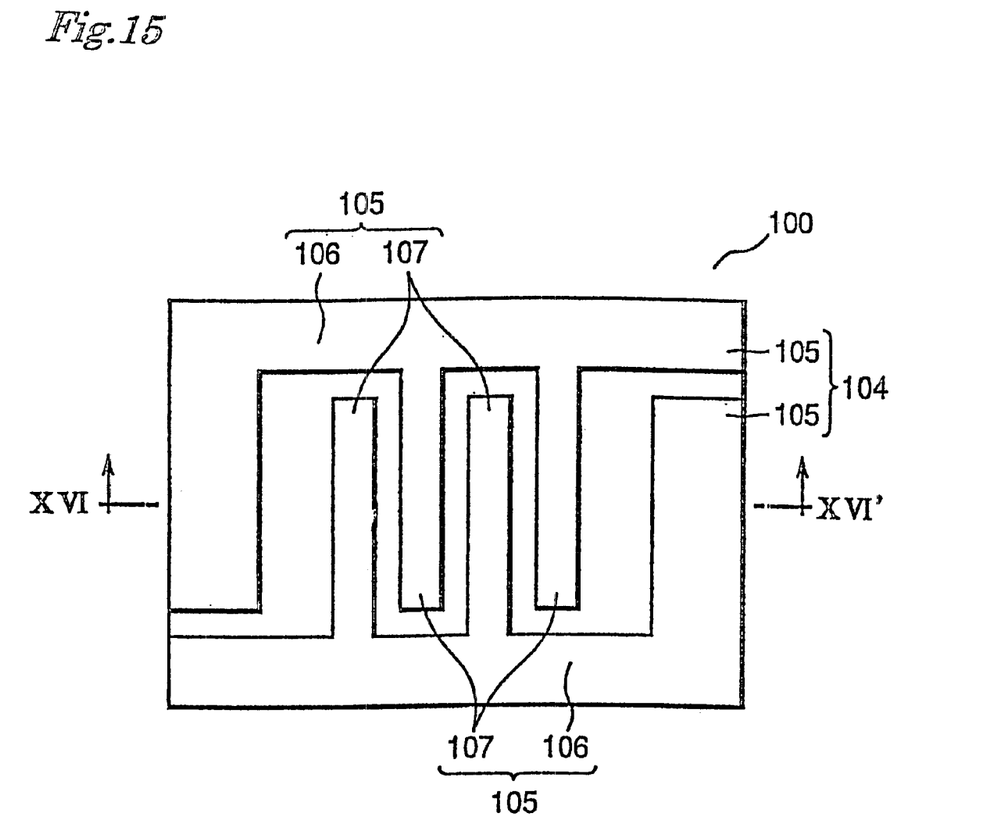
FIG. 15 shows the structure of the micro device of the prior art, in a plan view of the beam-like structure having the basic structure.
Figure 16:
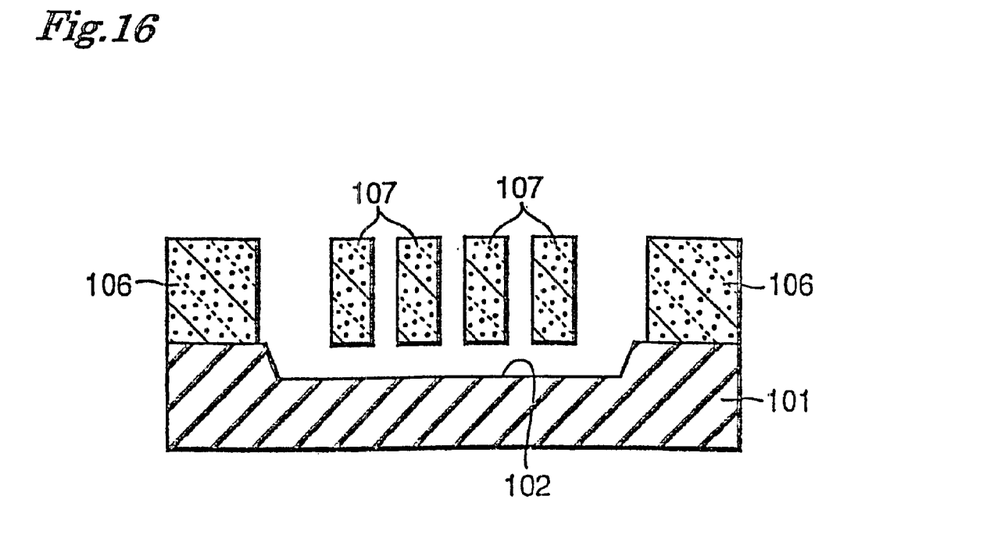
FIG. 16 shows the structure of the micro device of the prior art, in a sectional view taken along lines XVI–XVI' of FIG. 15.

FIG. 15 and FIG. 16 show the structure of an inertial force sensor as an example of basic structure of a micro device 100 of the prior art. FIG. 15 is a schematic plan view and FIG. 16 is a sectional view taken along lines XVI–XVI' of FIG. 15. The inertial force sensor 100 comprises an insulating substrate 101 having a recess formed in the surface thereof, and a beam-like structure 104 made of silicon so as to interpose the recess on the surface of the insulating substrate 101. The beam-like structure 104 further comprises two electrodes 105, 105. The electrode 105 comprises a supporting section 106 and a plurality of cantilevers 107. The cantilevers 107 are arranged to oppose each other via a minute clearance.

FIGS. 17A–17G are sectional views schematically showing the manufacturing process of the inertial force sensor shown in FIG. 15 of the prior art. A similar manufacturing process has been proposed, for example, by Z. Xiao et al. in Proc. of Transducers '99, pp. 1518–1521, and S. Kobayashi et al. in Proc. of Transducers '99, pp. 910–913.

Figure 17A:
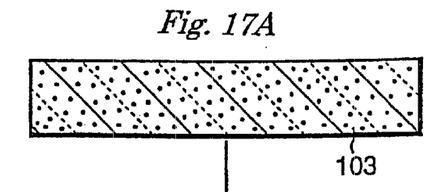
Figure 17B:
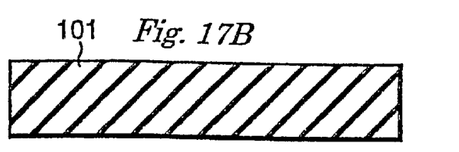
Figure 17C:
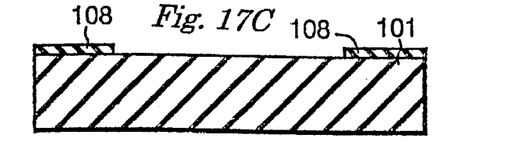
Figure 17D:
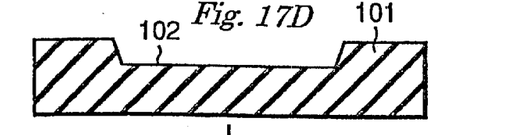
Figure 17E:
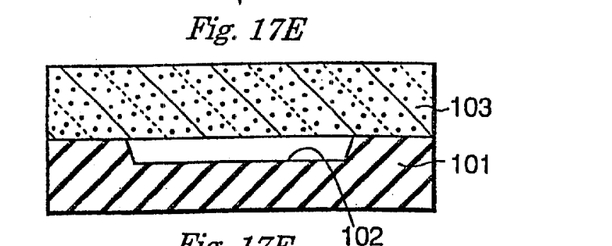
Figure 17F:
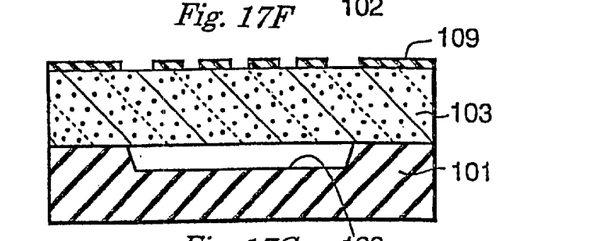
Figure 17G:
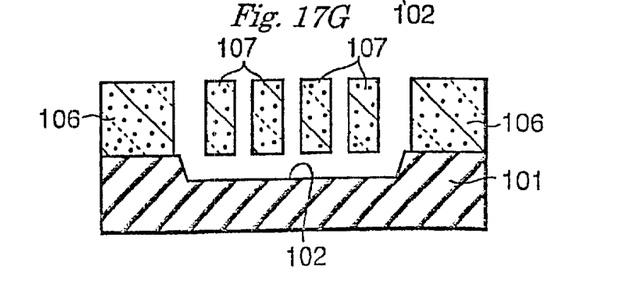

A silicon substrate 103 is provided in the step of FIG. 17A, and a glass substrate 101 is provided in the step of FIG. 17B. A mask film 108 is formed on the surface of the glass substrate 101 by photolithography in the step of FIG. 17C, and a recess 102 is formed by etching the surface of the glass substrate 101 to a depth in a range from several micrometers to several tens of micrometers with a dilute solution of hydrofluoric acid in the step of FIG. 17D. In the step of FIG. 17E, the silicon substrate 103 is bonded onto the surface of the glass substrate 101 by anodic bonding. In the step of FIG. 17F, a mask film 109 having a pattern that corresponds to the planar configuration of the beam-like structure 104 shown in FIG. 15 is formed by photolithography. In the step of FIG. 17G, the silicon substrate 103 is etched through by the ICP-RIE process, to form a cantilever 107. Then the resist remaining on the surface of the silicon substrate is removed.

The step of FIG. 17G involves a problem. The mask film 109 in the step of FIG. 17F generally has both of wide apertures and narrow apertures. Consequently, when a dry etching process such as the ICP-RIE process is applied to the silicon substrate 103 that has the mask film 109, the silicon substrate is etched at a higher rate in a portion exposed through the wider aperture than in a portion exposed through the narrower aperture due to the micro loading effect. As a result, the wider portion is etched through earlier than the narrower portion in the silicon substrate 103. At this time, etching gas enters into the clearance between the recess 102 of the glass substrate 101 and the back surface of the silicon substrate 103 through the hole which has been etched out in the silicon substrate 103 earlier. The etching gas which has entered erodes the back surface of the silicon substrate 103 till the narrowest portion is completely etched out. Thus the side wall of the supporting section 106 and the bottom surface or the side wall of the cantilever 107 are eroded. As a result, dimensions of the beam-like structure 104 deviate significantly from the designed values, making it impossible to obtain the target characteristics of the device.

Erosion of the supporting section and the cantilever due to the micro loading effect can be restricted by making the sizes of all apertures comparable when designing. However, this approach imposes severe limitation to the freedom of designing the device structure. Even when the dimensions of apertures are set to be the same in design, it is difficult to completely prevent the erosion of the supporting section and the cantilever in the actual process. This is because it is a common practice to apply over-etching to some extent in order to etch through reliably.

SUMMARY OF THE INVENTION

An object of the present invention is therefore to provide a micro device which has a beam-like structure that provides a sufficient degree of freedom in the design of the device structure by restricting the erosion of the supporting section and the cantilever due to the micro loading effect, and a method of manufacturing the same.

The present inventors have completed the present invention by finding that the problem described above can be solved by a micro device having an electrically conductive film which is formed on a recessed surface at least in a portion right under a cantilever of an insulating substrate and is electrically connected with a supporting section.

Specifically, the micro device of the present invention comprises an insulating substrate having a recess formed on the surface thereof, and a beam-like structure made of silicon formed on the front surface of the insulating substrate to surround the recess, wherein the beam-like structure comprises at least one functional section and the functional section has a supporting section bonded onto the insulating substrate and at least one cantilever formed integrally with the supporting section while extending across the recess.

The micro device also has an electrically conductive film formed on the surface of the recess at least in a portion right under a cantilever.

The micro device of the present invention has the following features.

Erosion of the supporting section made of silicon and the cantilever is caused, as described above, by the etching gas which enters into the clearance between the recess of the insulating substrate and the back surface of the silicon substrate which has been etched through earlier during the dry etching process. The silicon substrate is etched in such a mechanism of dry etching as activated ions having positive charge are accelerated by a negative bias formed right above the silicon substrate thereby to collide with the silicon substrate with a sufficient energy. In the case of the ICP-RIE process, the activated etching gas is usually sulfur fluoride ion ($SFx^+$). The ion turns into silicon fluoride ($SiFx$) through reaction with silicon, and is discharged to the outside. The negative bias is formed above the silicon substrate by applying a high frequency to a substrate holder that also serves as a cathode whereon the silicon substrate is placed.

Therefore, erosion of the back surface of the silicon substrate is considered to occur as the $SFx^+$ that has entered the clearance between the back surface of the silicon substrate and the recess of the insulating substrate is repulsed by the surface of the insulating substrate and collides with the back surface of the silicon substrate. Repulsion of the $SFx^+$ on the surface of the insulating substrate may be caused also by electrical repulsion force as well as kinematic scattering. The electrical repulsion force will be described below with reference to FIG. 13 and FIG. 14.

Figure 13:
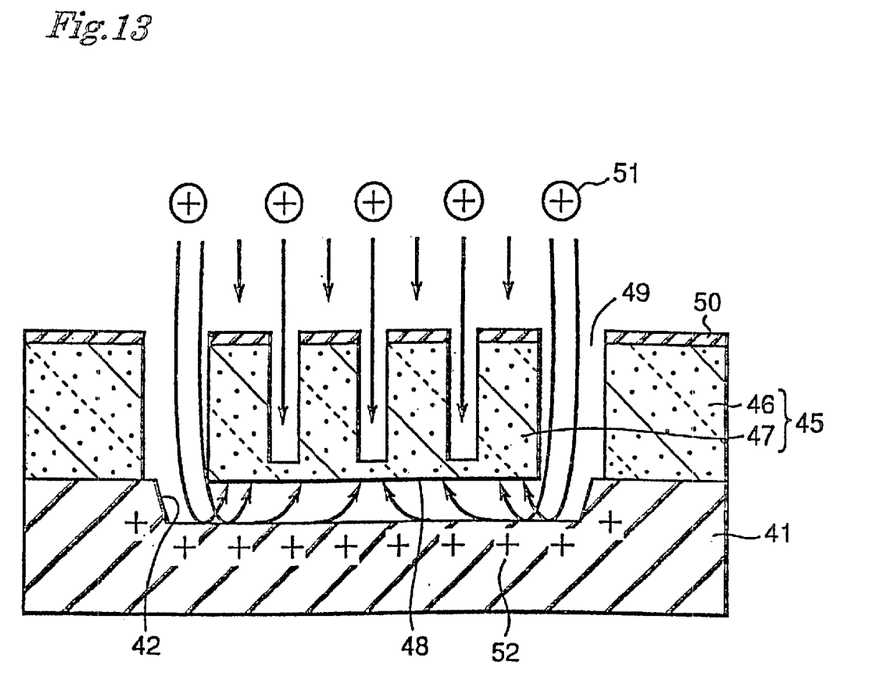
FIG. 13 is a drawing (part 1) showing the operating principle of the present invention.

FIG. 13 is a schematic sectional view showing a silicon substrate 45 bonded onto the surface of an insulating substrate 41, which has a recess, so as to surround the recess 42, in a state of the silicon substrate 45 being dry-etched. The silicon substrate 45 has a mask film 50 formed on the surface thereof for the purpose of forming a functional section. The silicon substrate 45 is formed into a supporting section 46 and a plurality of cantilevers 47 through dry etching.

During the dry etching process, the surface of the recess 42 of the insulating substrate 41 is charged with positive charge 52 by the etching gas which impinges thereon a number of times, for example, $SFx^+$ 51. The surface of the recess 42 charged with the positive charge repulses the $SFx^+$ 51 which comes next. The repulsed $SFx^+$ 51 changes the direction of the movement thereof before reaching the recess 42 and instead impinges on the back surface of the silicon substrate 45. Also it may be that the $SFx^+$ 51 which is bound to hit the insulating substrate 41 at right angles is distracted from the trajectory by the recess 42 that is positively charged, and impinges on the side wall of the supporting section 46.

Therefore, in order to restrict the erosion of the back surface of the silicon substrate 45 or the supporting section 46, it is effective to prevent the surface of the recess 42 of the insulating substrate 41 from being positively charged.

Figure 14:
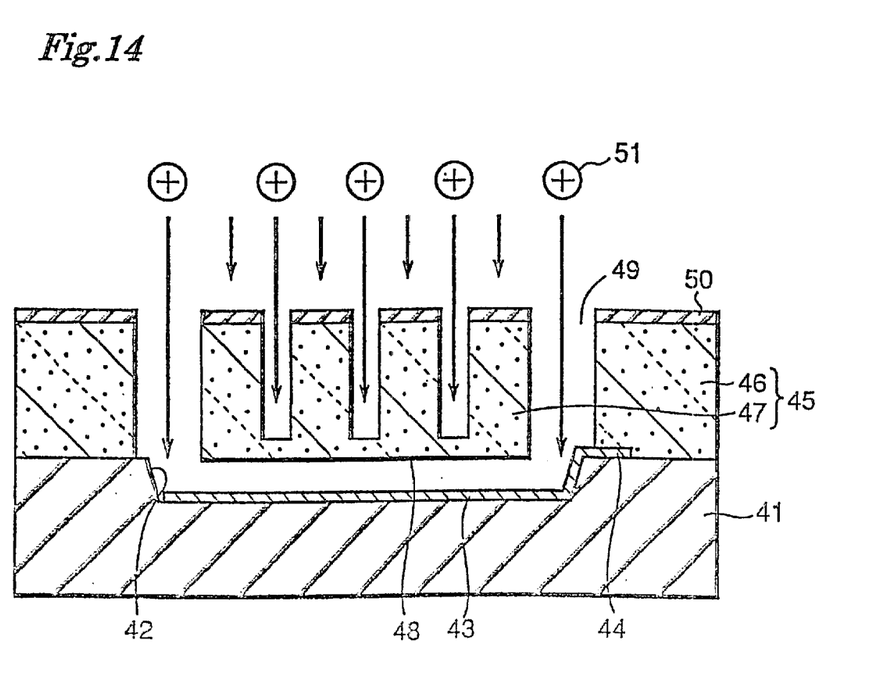
FIG. 14 is a drawing (part 2) showing the operating principle of the present invention.

According to the present invention, as shown in FIG. 14, the electrically conductive film 43 is formed on the surface of the recess 42 of the insulating substrate 41, and the surface of the recess 42 of the insulating substrate 41 is prevented from being positively charged by electrically connecting the electrically conductive film 43 and the supporting section 46. In this case, when the etching gas collides with the electrically conductive film 43, charge of the etching gas is discharged through the supporting section 46, thereby deactivating the etching gas. Since the silicon substrate 45 has the same potential as the substrate holder which is held at a negative potential during dry etching, charge of the etching gas is neutralized upon collision with the electrically conductive film 43, so that deactivation is accelerated.

While it suffices to form the electrically conductive film used in the present invention on the surface of the recess at least in a portion right under the cantilever, it is preferable to use the electrically conductive film formed over the entire surface of the recessed, which makes it possible to prevent the entire surface of the recess from being charged thereby restricting the erosion of the back surface of the silicon substrate more effectively.

The inertial force sensor of the present invention comprises an insulating substrate having a recess formed on the surface thereof, and a beam-like structure made of silicon formed on the front surface of the insulating substrate so as to interpose the recess, wherein the beam-like structure comprises a movable electrode and a fixed electrode, with the movable electrode and the fixed electrode each having a supporting section bonded onto the insulating substrate and a comb-shaped electrode comprising a plurality of cantilever electrodes formed integrally with the supporting section while extending across the recess. The cantilevers of the movable electrode and the fixed electrode are arranged to oppose each other via a minute clearance. In the inertial force sensor having such a constitution, an electrically conductive film which is electrically connected with the supporting section is formed on the surface of the recess at least in a portion right under the cantilever.

The inertial force sensor of the present invention has the electrically conductive film which is formed on the surface of the recess at least in a portion right under the cantilever, for the purpose of preventing the surface from being charged, and is electrically connected with the supporting section. Thus when the cantilever is formed by dry etching, the supporting section and the cantilever are not subject to erosion because the etching gas having positive charge loses the charge upon collision with the electrically conductive film and is neutralized. As a result, since there occurs no variation in the distance between the cantilevers that constitute the movable electrode and the comb-shaped electrode of the fixed electrode, such an inertial force sensor can be provided as the deterioration of sensitivity and variation in the characteristic are suppressed.

The micro device of the present invention comprises an insulating substrate having a recess formed on the surface thereof, a beam-like structure made of silicon formed on the front surface of the insulating substrate so as to interpose the recess, an optical fiber holder which is fastened on the beam-like structure and holds a plurality of optical fibers disposed at a predetermined distance, and electromagnetic attraction means fastened to oppose the back surface of the insulating substrate and the beam-like structure. The beam-like structure comprises a supporting section which has an aperture and cantilevers formed integrally with the supporting section. The supporting section is bonded onto the insulating substrate and has a fixed mirror provided at one end of the inner wall of the aperture, while the cantilever is formed to overhang from the other end of the inner wall of the aperture, with a movable mirror being provided to erect on the surface at the tip of the cantilever to oppose the fixed mirror. A magnetic film that reacts with the electromagnetic attraction means is formed on the back surface of the cantilever, so that the electromagnetic attraction means attracts the back surface of the tip of the cantilever onto the recess of the insulating substrate, via the magnetic film, thereby switching the mirror, that reflects the light incident from the optical fiber, from the movable mirror to the fixed mirror, thus switching the optical path and allowing the application as an optical switch.

The optical switch described above has an electrically conductive film which is formed on the surface of a recessed in a portion at least right under the cantilever of the insulating substrate and is electrically connected with the supporting section. As a result, when the silicon substrate is processed to form the cantilever by reactive etching, the etching gas having positive charge collides with the electrically conductive film and loses the charge thereby to be deactivated, and therefore the etching gas does not erode the back surface of the cantilever. Thus since the cantilever having a high accuracy of the profile is formed, such an optical switch can be provided as the deterioration of response characteristic during switching of the optical path and variation in the characteristics are suppressed.

The method of manufacturing the micro device of the present invention, which comprises the insulating substrate having the recess formed on the surface thereof and the beam-like structure made of silicon formed on the front surface of the insulating substrate so as to interpose the recess, wherein the beam-like structure comprises at least one functional section and the functional section has the supporting section bonded onto the insulating substrate and at least one cantilever formed integrally with the supporting section while extending across the recess, comprises a step of forming the electrically conductive film on the surface of the recess at least in a portion right under the cantilever of the insulating substrate and extending the electrically conductive film over the surface around the recess thereby to establish electrical continuity with a supporting section; a step of forming a first mask film which corresponds to the configuration of the supporting section on the surface of the silicon substrate; a step of forming the supporting section by etching the surface of the silicon substrate whereon the first mask film has been formed; a step of bonding the silicon substrate which has the supporting section and the insulating substrate which has the electrically conductive film so that the surfaces thereof oppose each other; a step of forming a second mask film which corresponds to the configuration of the cantilever on the back surface of the silicon substrate that has been bonded; and a step of etching the back surface of the silicon substrate having the second mask film formed thereon to penetrate through the silicon substrate by dry etching, thereby to form the cantilever of a desired pattern which extends across the recess.

According to the manufacturing method of the present invention, the electrically conductive film is formed on the surface of the recess of the insulating substrate for the purpose of preventing the surface from being charged. At this time, a part of the electrically conductive film is extended over the surface around the recess thereby to form an electrical lead to the supporting section. As the electrically conductive film is electrically connected to the supporting section, the electrically conductive film is kept at the same potential as the substrate holder which is electrically connected to the supporting section, and is subjected to a negative bias. Thus when etching the back surface of the silicon substrate, which has the second mask film formed thereon, thereby to penetrate through the silicon substrate by dry etching, the etching gas having positive charge collides with the electrically conductive film and loses the charge thereby to be deactivated, and therefore the etching gas does not erode the back surface of the cantilever. As a result, since the side wall of the supporting section and the bottom surface or side wall of the cantilever are not eroded, it is not necessary to design the apertures of the mask film to have similar dimensions. Thus the present invention can provide the manufacturing method of the micro device having the high accuracy beam-like structure made of silicon and a high degree of freedom of design.

For the dry etching process to form the cantilever, it is desirable to employ the ICP-RIE process, which makes it possible to form the beam-like structure mad of silicon having a high aspect ratio in a shorter period of time.

BRIEF DESCRIPTION OF THE DRAWINGS

The above and other objects and features of the present invention will become more apparent from the following description of the preferred embodiments thereof made with reference to the accompanying drawings, throughout which like parts are designated by like reference numerals and which:

FIGS. 7A–7H are sectional views (part 1) schematically showing manufacturing processes according to the third embodiment of the present invention, for manufacturing the acceleration sensor of the first embodiment;

FIGS. 8I–8R are sectional views (part 2) schematically showing processes for manufacturing the acceleration sensor of the first embodiment;

FIGS. 17A–17G are sectional views schematically showing the method of manufacturing the micro device shown in FIG. 15.

DETAILED DESCRIPTION OF THE PREFERRED EMBODIMENTS

Embodiment 1

Figure 1:
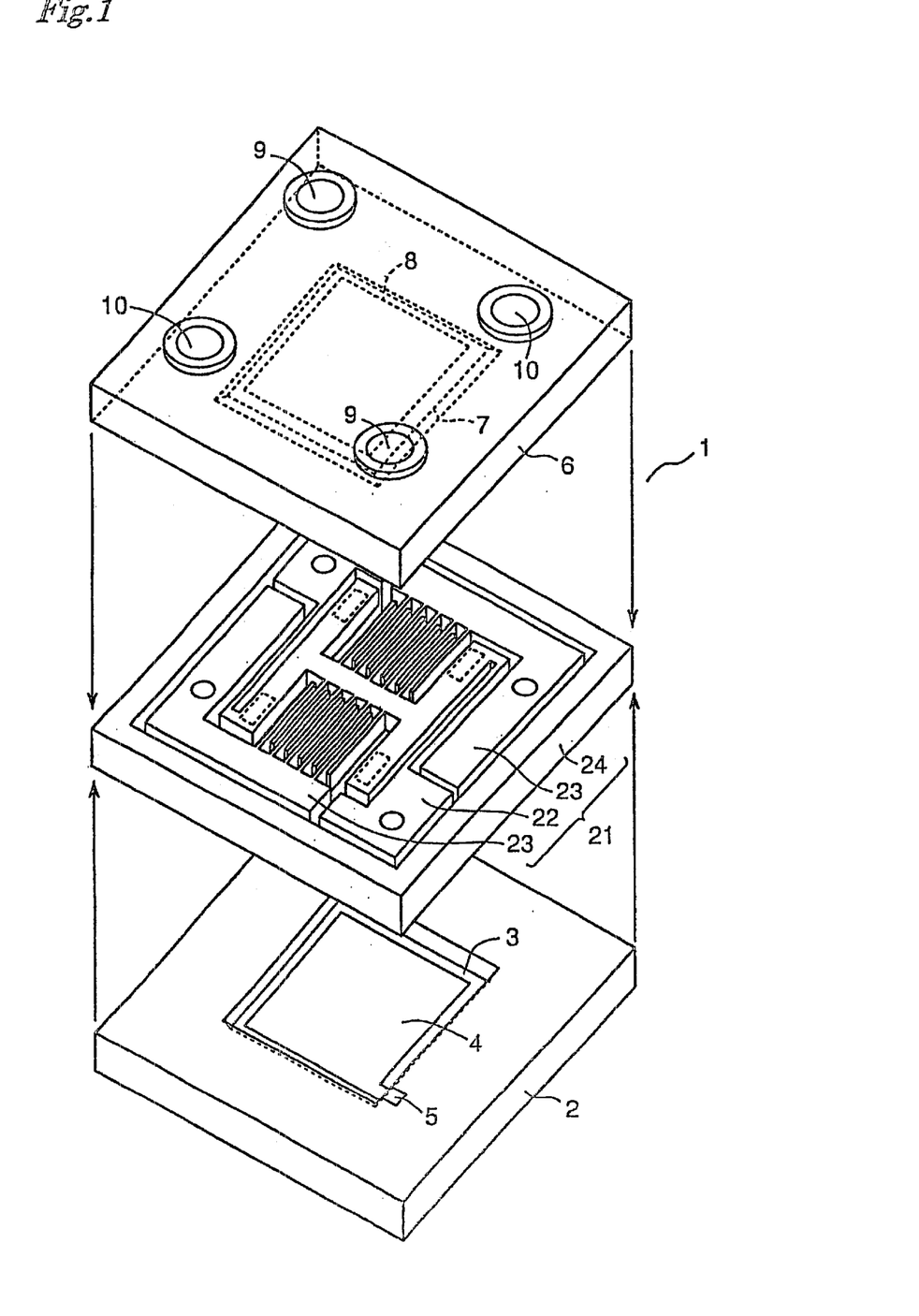
FIG. 1 is an exploded perspective view schematically showing the overall structure of the acceleration sensor according to the first embodiment of the present invention.
Figure 2:
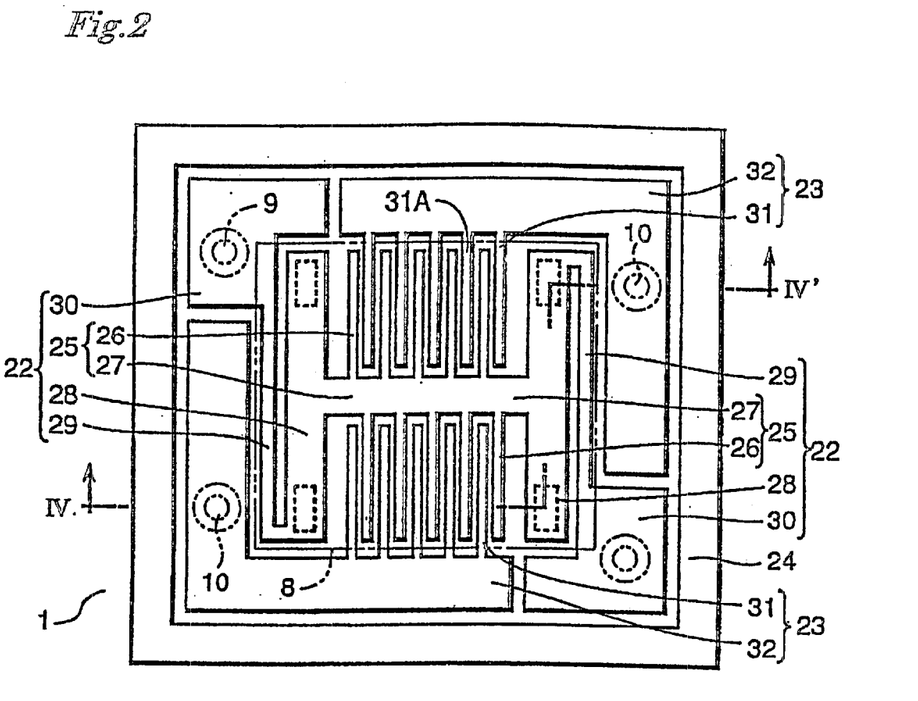
FIG. 2 is a plan view showing the structure of the acceleration sensor according to the first embodiment of the present invention, focusing on the beam-like structure.
Figure 3:
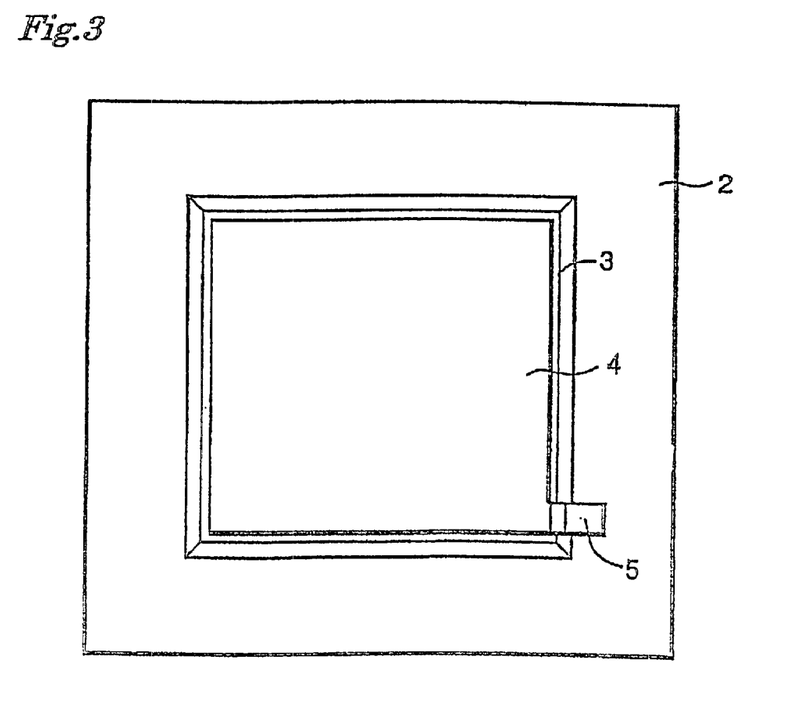
FIG. 3 is a plan view showing the structure of the acceleration sensor according to the first embodiment of the present invention, focusing on the lower glass substrate and the electrically conductive film.
Figure 4:
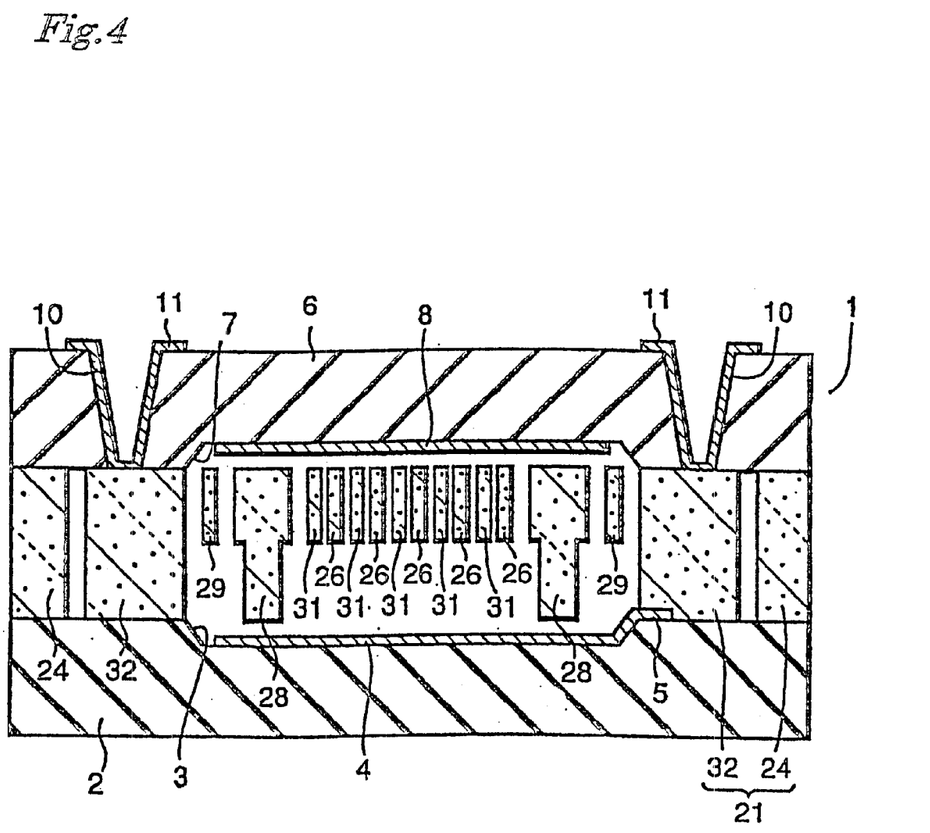
FIG. 4 is a sectional view taken along lines IV–IV' of FIG. 2 showing the structure of the acceleration sensor according to the first embodiment of the present invention.

As an example of the micro device of the present invention, an application thereof to acceleration sensor will be described below. FIG. 1 is an exploded perspective view of the acceleration sensor, FIG. 2 is a plan view of the acceleration sensor focusing on the beam-like structure made of silicon, FIG. 3 is a plan view of the acceleration sensor focusing on the lower glass substrate and the electrically conductive film, and FIG. 4 is a sectional view of the acceleration sensor taken along lines IV–IV'.

As shown in the perspective view of FIG. 1, the acceleration sensor 1 comprises a beam-like structure 21 made of silicon, a lower glass substrate 2 having a recess 3 formed in the surface thereof, and an upper glass substrate 6 having a recess 7 formed in the surface thereof. The acceleration sensor 1 has such a structure as the beam-like structure 21 is bonded so as to interpose between the lower glass substrate 2 and the upper glass substrate 6 so that the recess 3 and the recess 7 oppose each other, with the inside of the sensor being hermetically sealed. The upper glass substrate 6 has electrode leads 9, 10 which penetrate through the substrate for connecting to outside circuits, while the electrode leads 9, 10 make contact with the beam-like structure 21 in electrical continuity.

As shown in FIG. 1, the beam-like structure 21 comprises two functional sections, namely a movable electrode 22 and fixed electrodes 23, 23, and a sealed section 24. Further as shown in FIG. 2, the movable electrode 22 comprises a comb-shaped electrode 25 which consists of a plurality of cantilevers 26 extending across the recess 3 and a base portion 27, impact protection stoppers 28, 28 which are provided on both sides of the comb-shaped electrode 25 and restrict the vertical displacement of the comb-shaped electrode 25, two beams 29, 29 which are linked with the impact protection stoppers 28, 28 and support the comb-shaped electrode 25 and the impact protection stoppers 28, 28 in space, and supporting sections 30, 30 which are bonded onto the lower glass substrate 2 so as to support the beams 29, 29. The impact protection stopper 28 also has an effect of protecting the beams 29, 29 and the comb-shaped electrode 25 from being damaged by strong impact. The movable electrode 22 is integrally formed.

The fixed electrodes 23, 23 each comprises a comb-shaped electrode 31 which consists of a plurality of cantilevers 31A arranged to oppose the plurality of cantilevers 26, that extend across the recess 3, of the comb-shaped electrode 25 of the movable electrode 22 via a minute clearance, and a supporting section 32 which supports the comb-shaped electrode 31 and is bonded onto the lower glass substrate 2. The fixed electrodes 23, 23 are each integrally formed.

As shown in FIG. 3, the electrically conductive film 4 is formed over the entire surface of the recess 3 of the lower glass substrate 2. A part of the electrically conductive film 4 extends over the surface around the recess 3, and constitutes an electrical lead 5 for establishing electrical continuity with the supporting section 23 of the movable electrode 22. The supporting section 23 is bonded right above the electrical lead 5 as shown in FIG. 1.

While the electrical lead 5 is located right under the supporting section 23 of the movable electrode 22 in this embodiment, similar effect can be achieved also by forming the electrical lead right under the supporting section 32 of the fixed electrode 23.

As shown in FIG. 4, a metal film 8 is formed in the recess 7 of the upper glass substrate 6. The metal film 8 is provided for the purpose of, when carrying out anode bonding of the beam-like structure 21 and the upper glass substrate 6, preventing the movable electrode 22 which has been formed earlier from sticking onto the upper glass substrate 6.

The acceleration sensor 1 of the present invention senses horizontal acceleration in the plane of the beam-like structure 21 made of silicon. The comb-shaped electrodes 25, 31 constituted from a plurality of cantilevers contribute to the maximization of facing area of the opposing electrodes, that is proportional to a change in the electrostatic capacitance, within a limited area of the sensor.

The electrically conductive film 4 which is electrically connected to the supporting section 23 prevents the surface of the recess from being positively charged when forming the comb-shaped electrodes 25, 31 by the ICP-RIE process. Specifically, when the etching gas having positive charge collides with the electrically conductive film 4 during dry etching, the positive charge is discharged through the supporting section 23, and the etching gas is deactivated by the negative potential of the supporting section 23. Since the etching gas having positive charge is subjected to electrical repulsion of the recess 3 and does not impinge on the back surface of the silicon substrate, the etching gas does not erode the side walls of the comb-shaped electrodes 25, 31, the impact protection stoppers 28, 28 and the supporting sections 30, 32. As a result, the acceleration sensor of the present invention is less likely to suffer from deterioration in the sensitivity and variation in the performance among sensors, since the clearance between the plurality of cantilevers of the comb-shaped electrode is formed with a high accuracy and weight of the movable electrode and the fixed electrode can be controlled to a desired value.

While the electrically conductive film may be made of various electrically conductive materials such as chromium, aluminum, nickel, tantalum, platinum and gold which are metals that can be deposited by vapor deposition, chromium which deposits well on the glass substrate is preferable.

Thickness of the electrically conductive film is in a range from 10 nm to 1 μm, and preferably from 200 nm to 500 nm. When the thickness is below 10 nm, sufficient durability cannot be ensured during the reactive etching process, and a film larger than 1 μm in thickness requires longer time to form.

While the insulating substrate may be made of any insulating material as long as the material can be processed into a desired shape, glass substrate is preferable.

Embodiment 2

Figure 5:
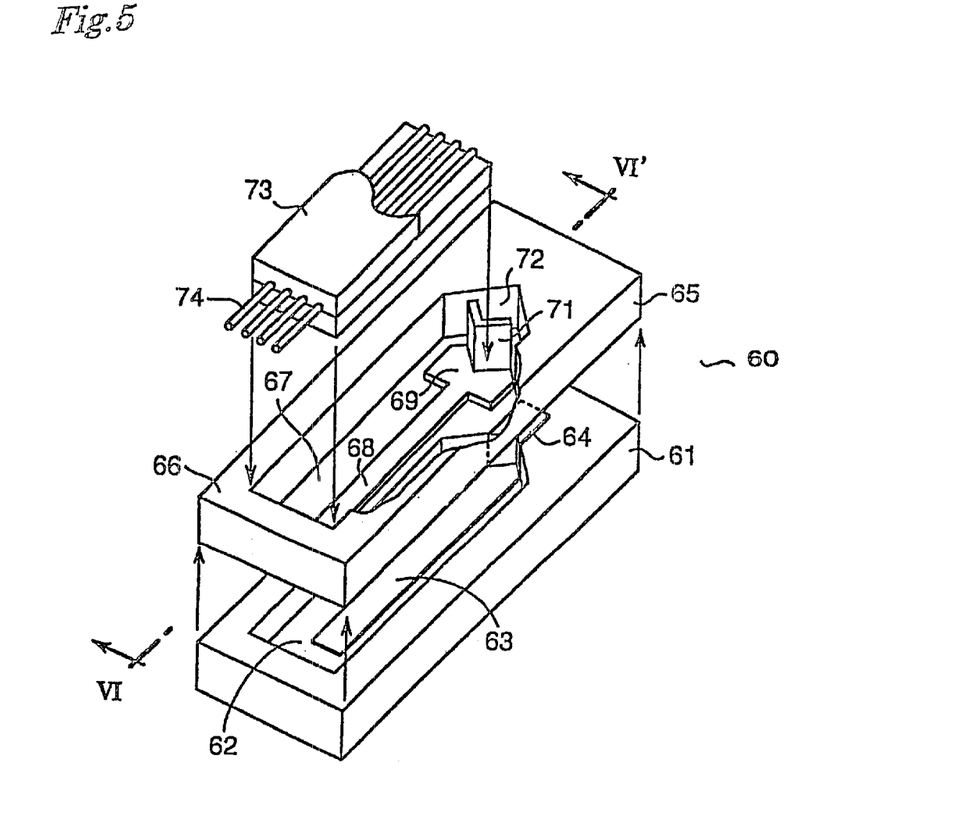
FIG. 5 is an exploded perspective view schematically showing the overall structure of the optical switch according to the second embodiment of the present invention.
Figure 6:
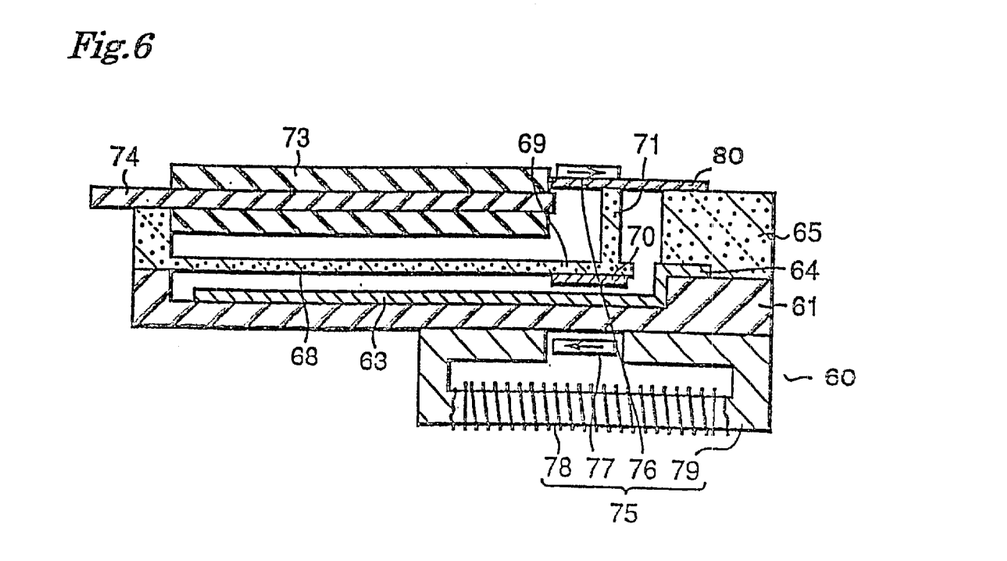
FIG. 6 is a sectional view taken along lines VI–VI' of FIG. 5 showing the structure of the optical switch according to the second embodiment of the present invention.

As an example of the micro device of the present invention, an application to optical switch will be described below. FIG. 5 is an exploded perspective view schematically showing the structure of an optical switch 60, and FIG. 6 is a sectional view of the optical switch 60 taken along lines VI–VI'. The optical switch 60 of the present invention comprises an insulating substrate 61 having a recess 62 formed on the surface thereof, a beam-like structure 65 made of silicon formed on the front surface of the insulating substrate 61 so as to interpose the recess 62, an optical fiber holder 73 which is fastened on the beam-like structure 65 and holds a plurality of optical fibers 74 disposed at a predetermined distance, and electromagnetic attraction means 75 which is not shown and is fastened to oppose the back surface of the insulating substrate 61 and the beam-like structure 65.

The beam-like structure 65 comprising a supporting section 66 which has an aperture 67 and cantilever 68 constitutes a functional section. The beam-like structure 65 further has a fixed mirror 72 provided at one end of the inner wall of the aperture 67, while the cantilever 68 is formed to overhang from the other end of the inner wall of the aperture 67, with a movable mirror 71 being provided to erect on the surface at the tip 69 of the cantilever 68 to oppose the fixed mirror 72. A magnetic film 70 that reacts with the electromagnetic attraction means 75 so as to be attracted thereby is formed on the back surface of the cantilever 68. An electrically conductive film 63 is formed on the surface of the recess 62 of the insulating substrate in a portion located at least right under the cantilever 68, and a part of the electrically conductive film 63 extending over the surface around the recess 62 forms an electrical lead 64 that is in electrical continuity with the supporting section 66 of the silicon substrate. The electromagnetic attraction means 75 comprises a first permanent magnet 76 which fixed on an upper support substrate 80, a second permanent magnet 77 which is fastened onto the back surface of the insulating substrate 61 so as to interpose the cantilever 68, and an electromagnet 79 which is fastened to surround the permanent magnet 77 and has a coil 78 wound thereon.

When there is no current flowing in the electromagnet 79, the cantilever 68 is separated from the insulating substrate 61 by a predetermined distance, and the tip 69 is held at a position of making contact with the upper support substrate 80, so that light from the optical fiber 74 is reflected by the movable mirror 71. When a current flows in the electromagnet 79 so as to magnetize in the same direction as the second permanent magnet 77, the magnetic film 70 is attracted so that the cantilever 68 is locked in such a state as the tip 69 is attracted to the insulating substrate 61. At this time, the mirror that reflects the light incident from the optical fiber 74 is switched from the movable mirror 71 to the fixed mirror 72. Thus the light incident from the optical fiber 74 is reflected by the fixed mirror 72, thereby switching the optical path.

According to this embodiment, since the electrically conductive film 63 that is in electrical continuity with the supporting section 66 of the silicon substrate 65 is formed on the surface of the recess 62 of the insulating substrate 61 right under the cantilever 68, the surface of the recess is prevented from being charged when forming the cantilever 68 by the reactive dry etching process. Thus the etching gas having positive charge is not subjected to electrical repulsion of the recess 62 and does not impinge on the back surface of the silicon substrate, and therefore erosion of the cantilever 68 does not occur. As a result, since the beam-like structure is formed with high accuracy in the shape, dimensions and weight, deterioration in the response characteristic can be suppressed when switching the optical path and high reliability can be provided to the optical switch.

Embodiment 3

Figure 7A:
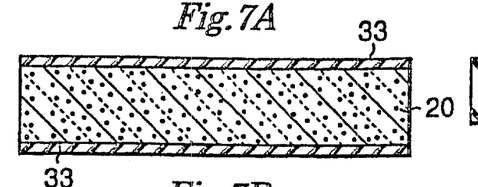
Figure 8I:
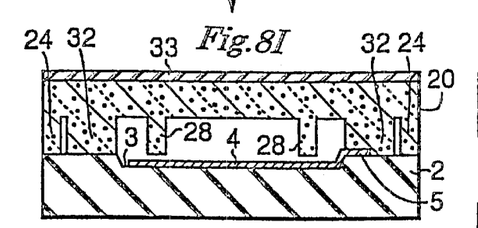

The manufacturing method of the present invention will be described below by taking the acceleration sensor as an example of the micro device. FIGS. 7A–7H, 8I–8R are sectional views schematically showing the process of manufacturing the acceleration sensor of the first embodiment.

Figure 7B:
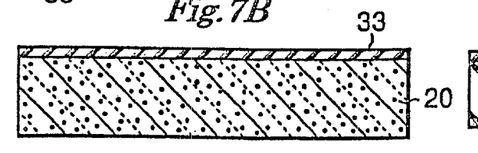
Figure 7C:
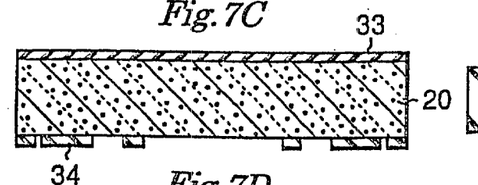
Figure 7D:
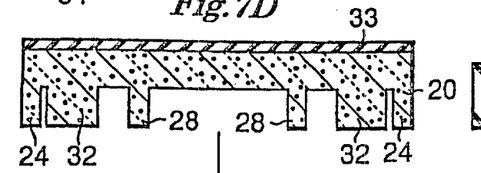

In the steps of FIGS. 7A to 7D, the silicon substrate is processed on the surface thereof to form the supporting section of the beam-like structure, while the electrically conductive film is formed on the lower glass substrate in the steps of FIGS. 7E to 7H. The silicon substrate and the lower glass substrate are bonded together and the silicon substrate is processed to form the comb-shaped electrode of the beam-like structure in the steps of FIGS. 8I to 8K. The upper glass substrate that has been processed in the step of FIG. 8P is bonded onto the beam-like structure in the step of FIG. 8Q, and the electrode leading portion is formed on the upper glass substrate in the step of FIG. 8R, thereby completing the acceleration sensor having the structure corresponding to the sectional view of FIG. 4. The process will now be described in detail below for each step.

In the step of FIG. 7A, a silicon substrate 20 (400 μm thick) having a thermal oxidation film 33 which is 1 μm in thickness formed on the surface thereof is prepared. In the step of FIG. 7B, the thermal oxidation film 33 of the silicon substrate 20 is removed using buffered hydrofluoric acid. In the step of FIG. 7C, the first mask film 34 is formed from a resist in accordance to the shape of the supporting section by photolithography on the surface of the silicon substrate 20. In the step of FIG. 7D, the silicon substrate 20 having the first mask film 34 is etched to a depth of 250 μm by the ICP-RIE process. Then the resist remaining on the surface is removed, and the supporting section 32, the sealing portion 24 and the impact protection stopper 28 are formed.

Figure 7E:
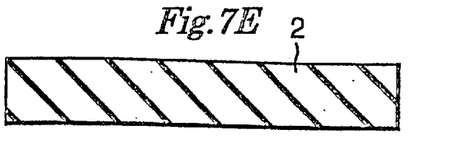
Figure 7F:
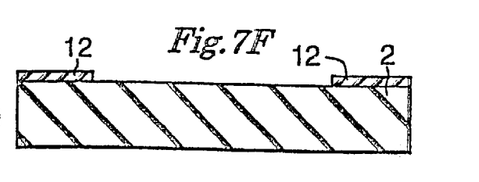
Figure 7G:
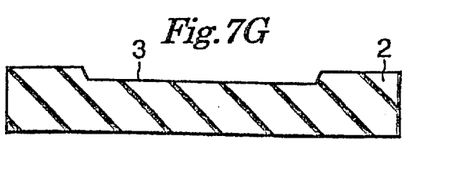
Figure 7H:
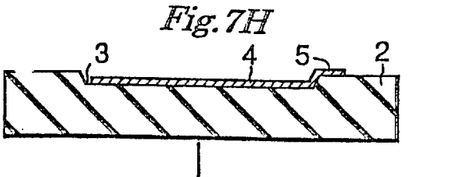

In the step of FIG. 7E, the lower glass substrate 2 (400 μm thick) is prepared. In the step of FIG. 7F, the mask film 12 is formed from a resist for the formation of recess by photolithography on the surface of the lower glass substrate 2. In the step of FIG. 7G, the surface of the lower glass substrate 2 is etched to a depth of 20 μm using a 10% aqueous solution of hydrofluoric acid, thereby to form the recess 3. In the step of FIG. 7H, a Cr film is formed over the entire surface of the recess 3 and to partially extend over the surface around the recess 3 by photolithography, thereby to form the electrically conductive film 4 made of Cr. The electrically conductive film 4 which extends over a part of the portion around the recess 3 form the electrical lead 5 that electrically connects with the silicon substrate 20.

Figure 8J:
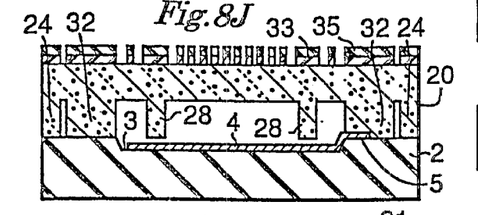
Figure 8K:
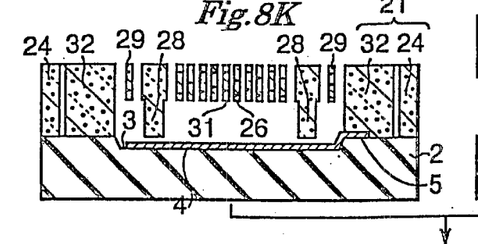
Figure 8L:
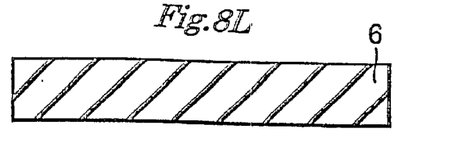
Figure 8M:
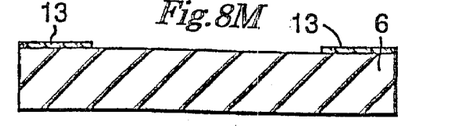

In the step of FIG. 8I, the surface of the lower glass substrate 2 and the surface of the silicon substrate 20 are bonded together by anode bonding process. At this time, the electrically conductive film 4 and the silicon substrate 20 are connected with each other by the electrical lead 5. In the step of FIG. 8J, a second mask film 35 is formed from a resist by the photolithography processing on the surface of the silicon substrate 20. Then a thermal oxidation film mask 33 is formed by electron cyclotron resonance reactive ion etching process (hereinafter referred to as ECR-RIE process). In the step of FIG. 8K, back surface of the silicon substrate 20 is etched to a depth of at least 150 μm by the ICP-RIE process using the second mask film 35 and the thermal oxidation film 33 as the masks. This results in the formation of the comb-shaped electrodes 25, 31 penetrating the silicon substrate 20. Only the cantilever 26 of the comb-shaped electrode 25 is shown in the drawing. Then the thermal oxidation film 33 that remains on the back surface of the silicon substrate 20 is removed by the ECR-RIE process. Depth 150 μm of etching is determined by subtracting the depth of etching 250 μm in the step of FIG. 7D from the thickness 400 μm of the silicon substrate 20.

Figure 8N:
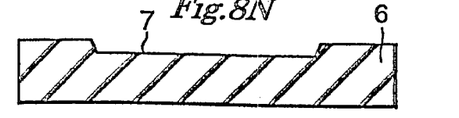
Figure 8O:
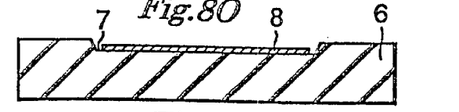
Figure 8P:
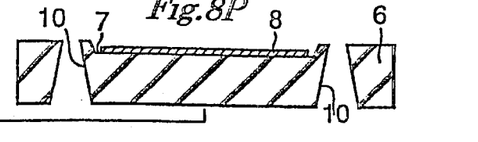

In the step of FIG. 8I, the upper glass substrate 6 (400 μm thick) is prepared. The mask film 13 is formed from a resist for the formation of the recess 7 by photolithography on the surface of the upper glass substrate 6. In the step of FIG. 8N, the surface is etched to a depth of 20 μm using a 10% aqueous solution of hydrofluoric acid, thereby to form the recess 7. In the step of FIG. 8O, a Cr film is formed on the surface of the recess 7 by the photolithography process, thereby to form the anti-sticking film 8 made of Cr. In the step of FIG. 8P, the upper glass substrate 6 is sand blasted to provide the electrode-leading portion 10 constituted from through hole.

Figure 8Q:
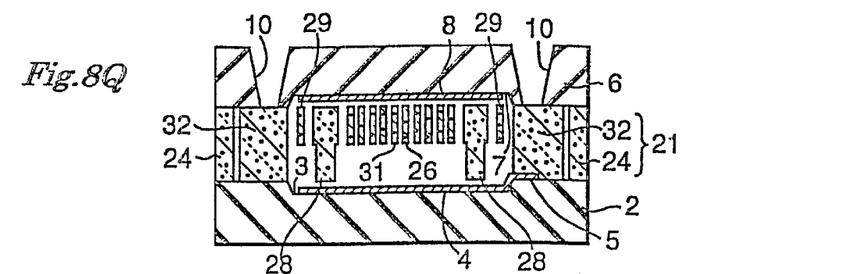
Figure 8R:
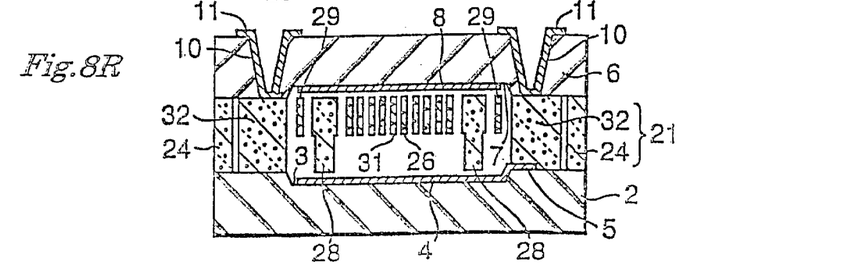
Figure 9A:
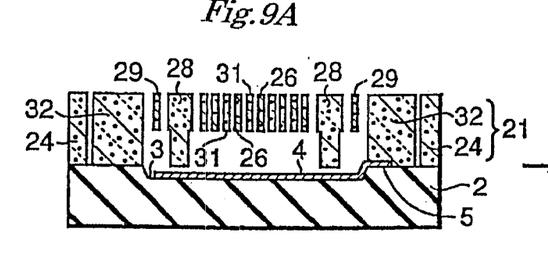
FIGS. 9A–9C show the structure of the beam-like structure bonded onto the insulating substrate according to an embodiment of the method of manufacturing the micro device of the present invention, FIG. 9A being a sectional view schematically showing the structure after etching by the ICP-RIE process, FIG. 9B being an enlarged perspective view of an impact protection stopper after etching, and FIG. 9C being an enlarged perspective view of the cantilever after etching.
Figures 9B, 9C:
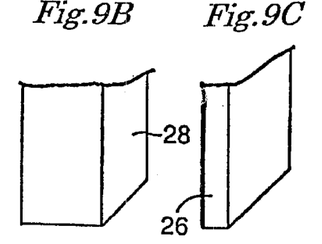
Figure 10A:
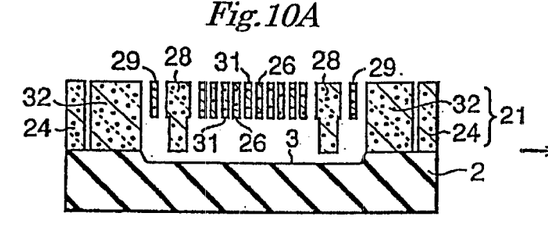
FIGS. 10A–10C show the structure of the beam-like structure bonded onto the insulating substrate in a first comparative example, FIG. 10A being a sectional view schematically showing the structure after etching by the ICP-RIE process, FIG. 10B being an enlarged perspective view showing the structure of the impact protection stopper after etching, and FIG. 10C being an enlarged perspective view showing the structure of the cantilever after etching.
Figures 10B, 10C:
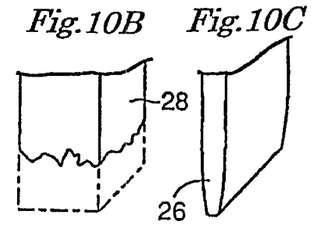
Figure 11A:
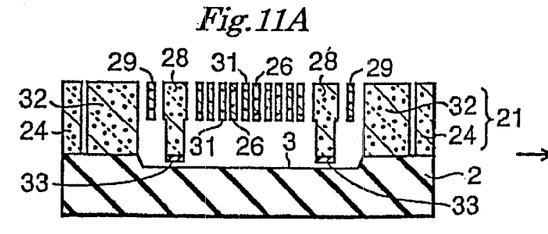
FIGS. 11A–11C show the structure of the beam-like structure bonded onto the insulating substrate in a second comparative example, FIG. 11A being a sectional view schematically showing the structure after etching by the ICP-RIE process, FIG. 11B being an enlarged perspective view showing the structure of the impact protection stopper after etching, and FIG. 11C being an enlarged perspective view showing the structure of the cantilever after etching.
Figure 11B:
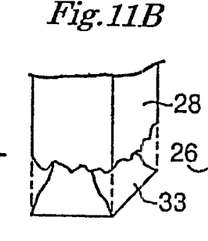
Figure 11C:
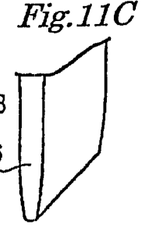
Figure 12A:
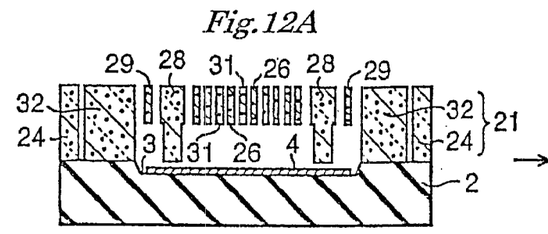
FIGS. 12A–12C show the structure of the beam-like structure bonded onto the insulating substrate in a third comparative example, FIG. 12A being a sectional view schematically showing the structure after etching by the ICP-RIE process, FIG. 12B being an enlarged perspective view showing the structure of the impact protection stopper after etching, and FIG. 12C being an enlarged perspective view showing the structure of the cantilever after etching.
Figures 12B, 12C:
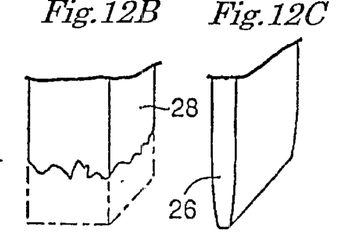

In the step of FIG. 8Q, the back surface of the silicon substrate 20 and the front surface of the upper glass substrate 6 are bonded together by anode bonding. Then an electrode film 11 made of Pt is formed on the electrode leading portion 10 in the step of FIG. 8R, thereby completing the acceleration sensor 1.

While the dry etching process well known in the prior art may be employed in the manufacturing method of the present invention, it is preferable to employ the ICP-RIE process which is capable of forming a beam-like structure having a high aspect ratio in a shorter period of time.

Now experiments for verifying the effects of the manufacturing method of the invention will be described below.

The first embodiment, in which the electrically conductive film 4 was formed from Cr on the surface of the recess 3 of the lower glass substrate 2, the electrical lead 5 was formed right under the supporting section 32 and the beam-like structure was formed by etching the silicon substrate by the ICP-RIE process, corresponds to the third embodiment. In the first comparative example, the beam-like structure was formed by a process similar to the third embodiment, except that the electrically conductive film 4 was not formed on the surface of the recess 3 of the lower glass substrate 2. In the second comparative example, the beam-like structure was formed by a process similar to the third embodiment, except that the thermal oxidation film 33 was left to remain as the protective film on the bottom surface of the impact protection stopper 28. In the third comparative example, the beam-like structure was formed by a process similar to the third embodiment, except that the electrically conductive film 4 was formed only on the surface of the recess 3 of the lower glass substrate 2, without providing the electrical lead 5.

The mask patterns used in the four experiments have apertures of widths in a range from 5 μm to 50 μm. The minimum width 5 μm is the distance between the cantilevers that constitute the movable electrode and the comb-shaped electrode of the fixed electrode. These values are common as the design value for such a micro device. The rate of etching silicon by the ICP-RIE process was estimated prior to the experiments, with the result of 2.0 μm/min. in a portion with aperture width of 5 μm and 3.3 μm/min. in a portion with aperture width of 50 μm. This difference is caused by the micro loading effect. Thus the etching time is calculated to be 75 minutes by dividing 150 μm by 2.0 μm/min. for a portion under an aperture 5 μm in width, and 45 minutes by dividing 150 μm by 3.3 μm/min. for a portion under an aperture 5 μm in width. This means that the back surface of the silicon substrate is exposed to the etching gas for 30 minutes obtained by 75 min. minus 45 min. till the substrate is completely etched through.

Results of these experiments will be described below. FIGS. 9A–9C to 12A–12C show the results of the embodiment and the comparative examples 1 to 3, respectively. FIGS. 9A–12A, FIGS. 9B–12B and FIGS. 9C–12C are schematic sectional views showing the structures of the insulating substrate and the silicon substrate after being etched by the ICP-RIE process, FIGS. 9B–12B being an enlarged perspective view of the impact protection stopper after etching, and FIGS. 9C–12C being an enlarged perspective view of the cantilever after etching. FIGS. 9B–12B and FIGS. 9C–12C are schematic diagrams prepared from photographs of the back surface of the silicon substrate taken with a scanning electron microscope (SEM). The alternate dot and dash line in the drawing indicates the original profile of the impact protection stopper 28.

In the case of the embodiment, bottom surface of the impact protection stopper 28 was not eroded. The cantilever 26 maintained substantially vertical side wall. In the case of the first comparative example, bottom surface of the impact protection stopper 28 was severely eroded, showing over etching of 40 μm over the design value. The cantilever 26 was eroded on the side wall resulting in narrowed tip. In the case of the second comparative example, bottom surface of the impact protection stopper 28 was eroded in a conical shape with the apex located on the thermal oxidation film 33. The thermal oxidation film 33 is used as a mask in the ICP-RIE process, and is etched at a rate as slow as about one hundredth that of silicon. Therefore, silicon in a portion covered by the thermal oxidation film 33 is protected, but the more distant from the covered portion, the more silicon is eroded. The cantilever 26 was eroded on the side wall resulting in narrowed tip, similarly to the first comparative example. In the case of the third comparative example, the impact protection stopper 28 and the cantilever 26 were both eroded similarly to the first comparative example.

The results described above show that the effects of the present invention cannot be achieved simply by forming the electrically conductive film 4 on the surface of the recess 3 of the lower glass substrate as in the third comparative example, in which case the etching gas cannot be prevented from eroding the back surface of the silicon substrate 20. When the bottom surface of the impact protection stopper 28 is eroded as in the case of the first comparative example and the third comparative example, function of the impact protection stopper cannot be achieved because the space between the lower glass substrate 2 and the silicon substrate 20 is enlarged. Also because erosion of the impact protection stopper 28 results in mass loss of the movable electrode, sensitivity of the sensor deteriorates including the case of the second comparative example. Also because erosion of the cantilever that occurred in the first to third comparative examples leads to increased distance between the cantilevers, deterioration in sensitivity of the sensor and variation in the characteristics among devices are caused.

As described above, as the micro device of the present invention has the electrically conductive film, which is electrically connected with the supporting section, being formed on the surface of the recess of the insulating substrate at least in a portion right under the cantilever, the insulating substrate can be prevented from being charged during dry etching. As a result, since erosion of the cantilever and the supporting section can be prevented, the beam-like structure made of silicon can be formed with high accuracy in the profile and dimensions. Thus high reliability and high degree of freedom in design are ensured.

Since the micro device of the present invention has the electrically conductive film formed over the entire surface of the recess, the entire surface of the recess can be prevented from being charged thus making it possible to suppress the erosion of the cantilever and the supporting section more effectively.

The inertial force sensor of the present invention has the electrically conductive film, which is electrically connected with the supporting section, being formed on the surface of the recess at least in a portion right under the cantilever that constitutes the comb-shaped electrode, the comb-shaped electrode and the supporting section can be prevented from being charged during dry etching. As a result, the comb-shaped electrode and the supporting section can be formed with high accuracy in the profile and dimensions, deterioration in sensitivity of the sensor and variation in the characteristics among devices can be suppressed. Thus an acceleration sensor or an angular velocity sensor having high reliability can be provided.

The method of manufacturing the micro device of the present invention includes a process of forming the electrically conductive film which prevents the insulating substrate from being charged during dry etching, and therefore the micro device having beam-like structure made of silicon with high accuracy in the profile and dimensions can be manufactured. Also because the manufacturing process is not affected by the micro loading effect, degree of freedom in design of the micro device having the beam-like structure can be improved significantly.

The manufacturing method of the present invention is capable of forming the beam-like structure of a high aspect ratio in a shorter period of time by employing the ICP-RIE process for dry etching.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. A micro device comprising:
   an insulating substrate having a recess at a surface of the insulating substrate;
   a beam-like silicon structure on the surface of the insulating substrate, surrounding the recess, the beam-like structure comprising at least one functional section having a supporting section bonded to the insulating substrate and at least one cantilever integral with the supporting section and extending across the recess; and
   an electrically conductive film electrically connected to the supporting section and on a surface of the recess, at least in a portion directly under the cantilever.

2. The micro device according to claim 1, wherein the electrically conductive film covers all of the recess.

3. An inertial force sensor comprising:
   an insulating substrate having a recess at a surface of the insulating substrate;
   a beam-like silicon structure on the surface of the insulating substrate, interposed in the recess, said beam-like structure comprising a movable electrode and a fixed electrode, with the movable electrode and the fixed electrode each having a supporting section bonded to the insulating substrate, and a comb-shaped electrode comprising a plurality of cantilever electrodes, integral with the supporting section and extending across the recess, the movable electrode and the fixed electrode opposing each other with a clearance between them; and
   an electrically conductive film electrically connected to the supporting section and on a surface of the recess, at least directly under the cantilever.

4. A method of producing a micro device comprising an insulating substrate having a recess at a surface and a beam-like silicon structure on the insulating substrate, interposed in the recess, said beam-like structure including at least one functional section having the supporting section bonded to the insulating substrate and at least one cantilever integral with the supporting section and extending across the recess, the method comprising:
   forming an electrically conductive film on the surface of the recess at least directly under the cantilever and extending around the recess to establish electrical continuity with a supporting section;
   forming a first mask film, which corresponds to the supporting section, on a surface of a silicon substrate;
   forming the supporting section by etching the silicon substrate on which the first mask film has been formed;
   bonding the silicon substrate that has the supporting section to the insulating substrate which has the electrically conductive film so that surfaces of the silicon and insulating substrates oppose each other;
   forming a second mask film which corresponds to the configuration of the cantilever on a back surface of the silicon substrate; and
   dry etching the back surface of the silicon substrate and penetrates through the silicon substrate, to form a cantilever which extends across the recess.

5. The method according to claim 4, including dry etching by reactive ion etching, using an inductively coupled plasma (ICP-RIE), to form the cantilever.

* * * * *